US005974154A

United States Patent [19]

Nagata et al.

[11] Patent Number: 5,974,154

[45] Date of Patent: *Oct. 26, 1999

[54] EFFECTOR WITH INTEGRAL SETTING OF CONTROL PARAMETERS AND ADAPTIVE SELECTING OF CONTROL PROGRAMS

[75] Inventors: Yuichi Nagata; Satoshi Suzuki; Morito Yamada; Masao Yoshida; Mikio Kitano; Kiyoto Kuroiwa; Shigenobu Kimura, all of Hamamatsu, Japan

[73] Assignee: Yamaha Corporation, Hamamatsu, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/501,462

[22] Filed: Jul. 12, 1995

[30] Foreign Application Priority Data

Jul. 14, 1994 [JP] Japan .................................... 6-162413

[51] Int. Cl.6 ........................................ H03G 3/00

[52] U.S. Cl. ........................................ 381/63; 381/61

[58] Field of Search .............................. 381/63, 62, 61, 381/66; 84/630

[56] References Cited

U.S. PATENT DOCUMENTS 5,040,220 8/1991 Iwamatsu .
5,666,136 9/1997 Fujishita .................................... 381/1

FOREIGN PATENT DOCUMENTS 0373982 11/1989 European Pat. Off. .
2068597 3/1990 Japan .

*Primary Examiner*—Minsun Oh Harvey
*Attorney, Agent, or Firm*—Pillsbury Madison & Sutro LLP

[57] ABSTRACT

In an echo effector for imparting an echo effect to an audio signal based on values of a plurality of parameters, a memory is provided for memorizing an interrelationship among the plurality of the parameters which are mutually related to each other. A dial is actuated for independently setting one or more of the parameters to desired values. A microcomputer dependently sets the remaining parameters to appropriate values according to the desired values and the memorized interrelationship. Further, in a sound field effector operative according to a selected program for creating an effect simulative of a sound field in matching with a room situation under which the effector is installed, a program memory stores a plurality of programs which can be selected in terms of types of sound fields and types of room situations. A first switch is operated for designating a desired type of a sound field. A second switch is operated for designating a desired type of a room situation. One program is selected from the program memory according to both of the designated type of the sound field and the designated type of the room situation.

7 Claims, 6 Drawing Sheets

| Dial scale | Delay time | |
|---|---|---|
| | Old range | New range |
| | ⋮ | ⋮ |
| 0 | 100 | 115 |
| 0.5 | 105 | 120 |
| 1 | 110 | 125 |
| 1.5 | 115 | 130 |
| 2 | 120 | 135 |
| 2.5 | 125 | 140 |
| 3 | 130 | 145 |
| 3.5 | 135 | 150 |
| 4 | 140 | 155 |
| 4.5 | 145 | 160 |
| 5 (Center) | 150 | 165 |
| 5.5 | 155 | 170 |
| 6 | 160 | 175 |
| 6.5 | 165 | 180 |
| 7 | 170 | 185 |
| 7.5 | 175 | 190 |
| 8 | 180 | 195 |
| 8.5 | 185 | 200 |
| 9 | 190 | 205 |
| 9.5 | 195 | 210 |
| 10 | 200 | 215 |
| | ⋮ | ⋮ |

EFFECTOR WITH INTEGRAL SETTING OF CONTROL PARAMETERS AND ADAPTIVE SELECTING OF CONTROL PROGRAMS

BACKGROUND OF THE INVENTION

The present invention relates to an effector apparatus integrated into an audio amplifier such as a karaoke amplifier which is used by many and unspecified users.

In a specific use of the amplifier such as karaoke amusement, various effects including an echo and a sound field are imparted to an audio signal such as a musical sound signal which is amplified by the amplifier. In the karaoke amusement, the various effects are applied to the audio signal in order to improve atmosphere of the performance and situation.

Referring to FIG. 7, a conventional echo effector is briefly described. The echo effector has a front operation panel which contains three dials 11, 12 and 13 for adjusting a delay time, a repeat and an echo level, respectively. The echo effector imparts an echo to an inputted audio signal according to these parameters of the delay time, the repeat and the echo level. Such an echo effector is integrated into the karaoke amplifier or the like. However, these parameters are not independent from each other, but are mutually related to each other. Therefore, an adjustment of one parameter affects values of the remaining parameters. For example, the value of the echo level is unwantedly varied when either of the delay time and the repeat is adjusted. Therefore, it would be difficult to freely set a desired value of the echo level. If such an echo effector is owned by a specified user, a total adjustment may be conducted by trial and error method. However, the karaoke amplifier is generally used by many and unspecified persons. It is practically difficult for each person to set a desired echo effect according to his/her preference.

In another point of view, a range of each parameter is preset by factory. Therefor, a user can only operate the dials 11, 12 and 13 within the fixed range. The user (could not adjust, a value of each parameter beyond the preset range. For example, if the range of the delay time is preset from 0 msec to 100 msec, the user could not set the value of the delay time to 150 msec out of the range. Generally, the karaoke amplifier is used by many and unspecified persons having diverse and different preferences over a wide range. Therefore the factory-set range could not cover such an actual wide range.

In a separate point of view, a sound field effector is integrated into the karaoke amplifier in addition to the echo effector. The sound field effector is operated by a control program to create a typical sound field. However, the karaoke amplifier is installed in various types of rooms. The program is edited by a user to modify the sound field to conform with situation of the room. This edit work may be conducted initially at the installation. However, if the amplifier is replaced, the edit work must be done again. Even worse, if the sound field effector stores a plurality of control programs corresponding to different types of sound fields, such an edit work must be carried out for each program.

SUMMARY OF THE INVENTION

As noted above, the conventional echo effector and the sound field effector are not designed in taking account of many and unspecified users thereby suffering from poor operability and complicated initial setting. In view of the drawbacks of the prior art, an object of the invention is to provide an effector exhibiting improved operability for many and unspecified users, when applied to a karaoke amplifier or the like.

According to a first aspect of the invention in an effector for imparting an effect to an audio signal based on values of a plurality of parameters, a parameter setting apparatus comprises memory means for memorizing an interrelationship among the plurality of the parameters which are mutually related to each other, first setting means for independently setting one or more of the parameters to desired values, and second setting means for dependently setting the remaining parameters to appropriate values according to the desired values and the memorized interrelationship. In operation, one or more of the parameters is manually set while the remaining parameters are automatically set by computation dependently on the manually set parameter(s). Therefore, the free setting of one parameter does not cause unwanted variation of other parameters, thereby avoiding the effect from deviating from a desired condition. Further, the user does not need to adjust all of the parameters.

According to a second aspect of the invention, in an effector for imparting an effect to an audio signal according to a value of a parameter, a parameter setting apparatus comprises input means having a scale composed of ordered marks for normally pointing a mark in order to set the parameter, and for occasionally inputting a command to change a range of the parameter, memory means for memorizing a correspondence between the scale of the input means and the range of the parameter, determining means for determining a value of the parameter within the range according to the pointed mark based on the memorized correspondence between the scale and the range, and changing means operative according to the command for rewriting the correspondence between the scale and the ranger memorized in the memory means so as to effect the change of the range. In the range change operation, the input means is manually operated to point a mark remote from a reference point such as a center mark, while an auxiliary switch is depressed to input the range change command. Consequently, the range of the parameter is shifted by a difference between the pointed mark and the center mark. Stated otherwise, a new value of the parameter is changed to a sum of an old value and that difference.

According to a third aspect of the invention, in an effector operative according to a selected program for creating an effect simulative of a sound field in matching with a room situation under which the effector is placed, a program selecting apparatus comprises memory means for storing a plurality of programs which can be selected in terms of types of sound fields and types of room situations, first designating means for designating a desired type of a sound field, second designating means for designating a desired type of a room situation, and selecting means for selecting one program from the memory means according to both of the designated type of the sound field and the designated type of the room situation. In the inventive apparatus, the plurality of the programs are prepared correspondingly to not only the types of the sound fields, but also the types of the room situations. These programs are preset by factory. The user can create a desired sound field in taking account of an actual room situation without modification of the program.

DETAILED DESCRIPTION OF THE INVENTION

Figure 1:
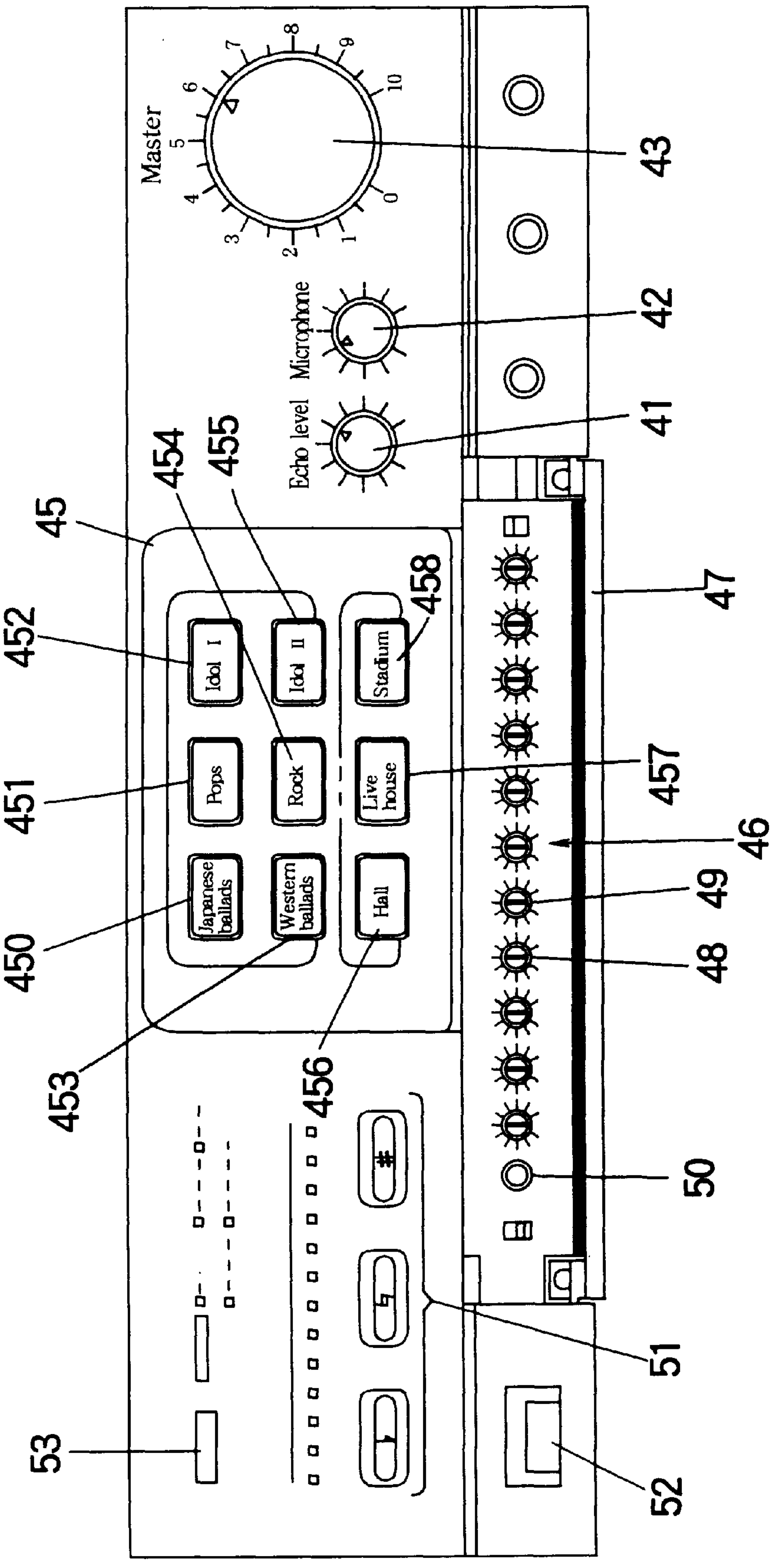
FIG. 1 shows a front view of an inventive karaoke amplifier.

Hereinafter, embodiments of the invention will be described in conjunction with the drawings. FIG. 1 shows a front view of an operation panel of an inventive karakoe amplifier. Namely, the invention is applied to the karaoke amplifier which imparts a desired echo effect to a live voice signal inputted from a microphone while mixing the voice signal with a musical sound signal of an orchestral accompaniment (karaoke) fed from an external source such as an optical disk and VTR, and which further creates a sound field effect to present an audio spatial atmosphere.

As shown in the figure, the operation panel is provided with knobs or dials 41, 42 and 43. Normally a user is allowed to operate the dial 41 to adjust an echo level. The dial 42 is operated to separately adjust a tone volume of the live voice from the microphone. The master dial 43 is operated to adjust a total tone volume.

The panel has on its central area a switch group 45 containing nine buttons 450–458 for selecting various effects such as a vocal effect and a sound field effect. Each of the buttons 450–458 is formed of half-transparent plastic material. As will be described later, each button is lighted red in a selected state, and is lighted green in a non-selected state, thereby enabling the user to readily recognize the state of each button. Further, a sealed box 46 is provided under the panel 45. Normally, the box 46 is sealed by a cover 47 such that the user cannot touch the box 46. In the figure, the cover 47 is opened for adjustment operation. The sealed box 46 contains a dial 48 for adjusting a delay time, another dial 49 for adjusting a repeat (reverberation time) and a command switch 50. These dials and switch are normally sealed, and therefore are not actuated. Another switch group 51 is provided on a left side of the panel 45 for key adjustment. The switch group 51 is actuated to shift a key of the musical sound signal up and down by a half-tone, or otherwise to set a standard or natural key. Further, various effects are introduced by the set keys. A power switch 52 is disposed under the switch group 51. A photo-receiver 53 is disposed over the switch group 51 for receiving an infrared-ray transmitted from a remote controller (not shown).

Figure 10:
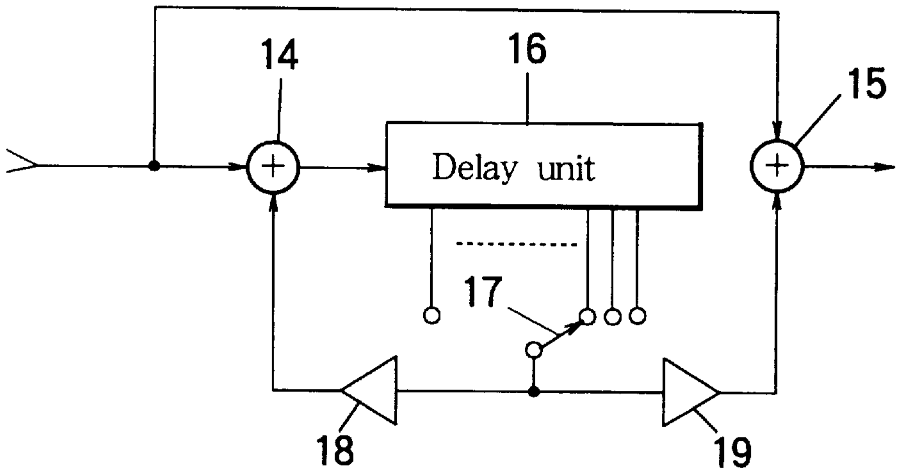
FIG. 10 is a block diagram showing a simplified electrical structure of an echo effector.

The inventive karaoke amplifier incorporates therein an echo effector. Before describing an inventive feature of the echo effector, general construction and operation thereof will be discussed briefly in conjunction with FIG. 10 to facilitate understanding of the invention. The general echo effector treats a digital signal. An audio input signal is converted by an A/D converter for admission, while an output signal is converted by a D/A converter. As shown in FIG. 10, the input signal is applied to an input terminal of an adder 14, and is also applied to one input terminal of another adder 15. An added result of the adder 15 is outputted as an output signal of the echo effector. On the other hand, an added result of the adder 14 is fed to a delay unit 16. The delay unit 16 is composed of a RAM and other elements, and operates in synchronization with a sampling clock to sequentially write data of the audio signal to be delayed into the RAM according to addresses counted by the clock, and to sequentially read the data after a predetermined time interval, thereby achieving the delay of the digital audio signal. The delay unit 16 has a plurality of output taps which correspond to stepwise different delay times. On of the taps is selected by a switch 17 which is linked to a first dial (not shown) so as to set a desired delay time. A delayed signal selected by the switch 17 is fed back to another input terminal of the adder 14 through a multiplier 18, a gain of which is variably controlled by a second dial (not shown). The same delayed signal is fed forward to another input terminal of the adder lo to add with the input signal through a multiplier 19, a gain of which is variably controlled by a third dial (not shown), thereby forming the output signal.

In such a construction of the echo effector, the second dial is actuated to vary the gain of the amplifier 18 so as to adjust a repeat of the echo. However, this adjustment causes variation in an attenuation degree of a signal circulating a loop composed of the delay unit 16, the switch 17, the multiplier 18 and the adder 14. Consequently, a magnitude of a signal fed to the amplifier 19 is varied. Therefore, an output level of the multiplier 19 varies, even though the gain of the multiplier 19 is fixed. Further, the first dial is actuated to vary the delay time, which consequently varies a circulation time of the loop. Consequently, the magnitude of the signal fed to the multiplier 19 is also varied. Therefore, the output level of the multiplier 19 is varied even though the gain thereof is fixed. Therefore, there is an inherent interrelation among these parameters of the repeat, the delay time and the echo level.

Figure 2:
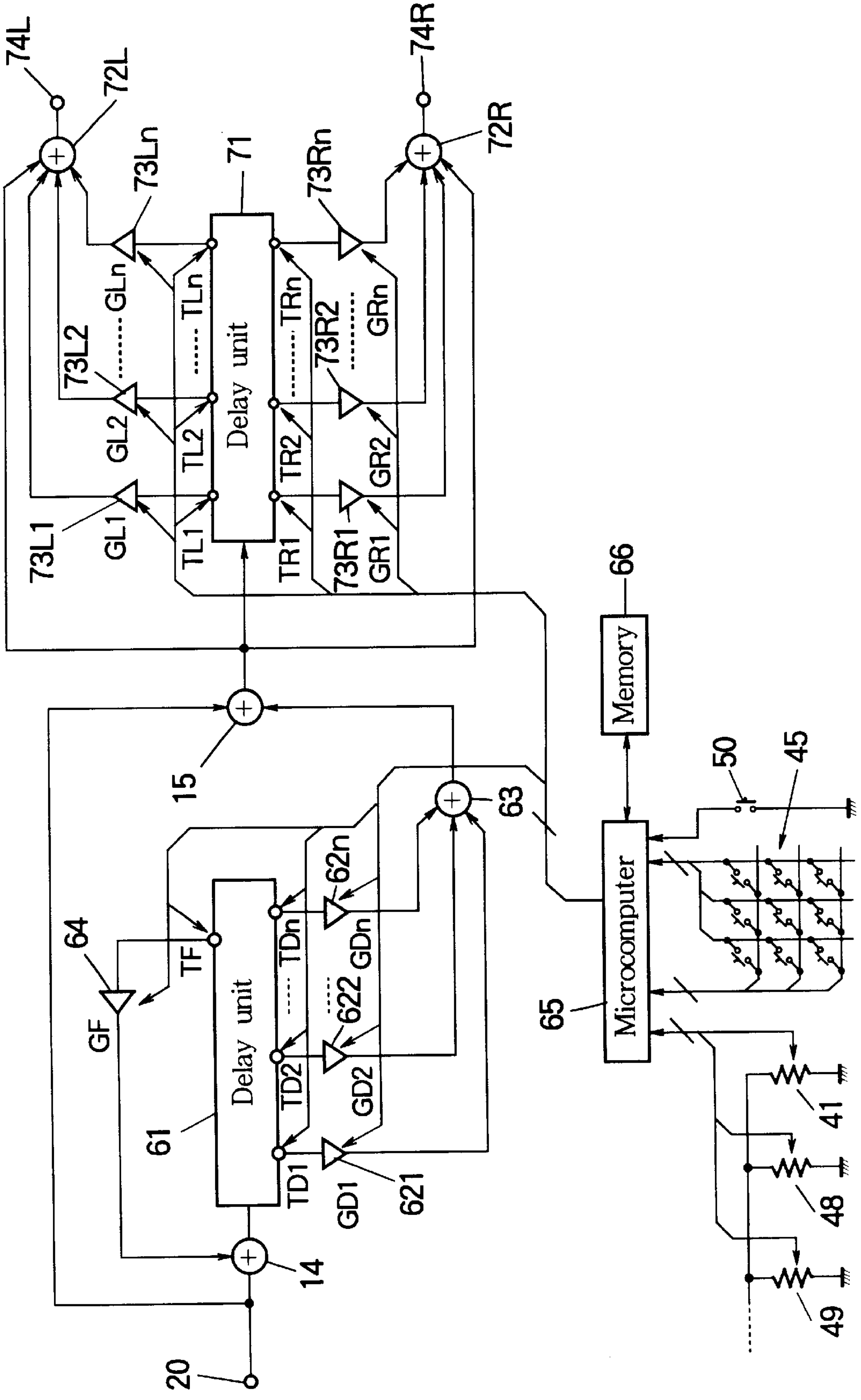
FIG. 2 is a block diagram showing an embodiment of an echo effector installed in the karaoke amplifier.

Now, referring to FIG. 2, the description is given for an embodiment of an inventive echo effector integrated in the karaoke amplifier of FIG. 1. The echo effector has a preceding stage for creating a simple echo, and a succeeding stage for creating a non-directional reverberation. The preceding and succeeding stages are controlled by a common microcomputer 65. As shown in tile figure, an audio input signal is fed through a terminal 20 to one input terminal of an input adder 14 and to one input terminal of an output adder 15. An added result of the adder 15 is outputted as a preceding output signal. On the other hand, an added result of the adder 14 is fed to a delay unit 61. The delay unit 61 is composed of a memory such as RAM, and operates according to an address counted in synchronization with a sampling clock for sequentially writing data of the signal to be delayed into the memory, and for sequentially reading out the data after a given time interval, thereby achieving the signal delay.

The delay unit 61 has a plurality of output terminals TD1–TD*n* which output stepwise delayed signals having stepwise different delay times. The respective delayed signals are multiplied by corresponding multipliers **621–62*n*** with multiplication factors or gail factors GD1–GD*n*. An adder 63 computes a sum of these multiplied results. The summed result by the adder 63 is fed to another input terminal of the output adder 15. Further, the delay unit 61 outputs through an output terminal TF a separate delayed signal having a given delay time, which is then multiplied by a multiplier 64 with a gain factor GF. The multiplied result is fed back to another input terminal of the adder 14. In such a construction, the microcomputer 65 sets the gain factors GD1–GD*n* and GF, and selects the output terminals TD1–TD*n* and TF. In the setting and selecting, the microcomputer 65 reads out control data from a memory 66 according to states of the switch group or matrix 45, the dials 41, 48 and 49, and the command switch 50.

Further, the summed result by the adder 15, i.e., the preceding signal modified by the echo, is fed to respective input terminals of a delay unit 71, a left channel adder 72L and a right channel adder 72R in the succeeding stage. The delay unit 71 is composed of a RAM or the like, and operates according to an address counted in synchronization with a sampling clock for successively writing data of the preceding output signal to be delayed into the RAM and for successively reading the data after a given delay time interval, thereby achieving the signal delay in manner similar to the preceding delay unit 61. The succeeding stage has a pair of left and right channels for imparting a non-directional reverberation to stereophonic sounds.

The delay unit 71 outputs from terminals TL1–TL*n* and TR1–TR*n* delayed signals having stepwise different delay times. The signals outputted from the left channel terminals TL1–TL*n* are multiplied by corresponding multipliers 73L1–73L*n* with given gain factors GL1–GL*n*. The adder 72L calculates a sum of these multiplied results and the preceding output signal from the adder 15, which is then outputted from an output terminal 74L as a left channel signal of the effector. In similar manner, the respective delayed signals from the output terminals TR1–TR*n* are multiplied by corresponding multipliers 73R1–73R*n* with gain factors GR1–GR*n*. The adder 72R calculates a sum of these multiplied results and the preceding echo signal from the adder 15, which is then outputted from another output terminal 74R, as a final right channel signal of the effector. The microcomputer 65 calculates the gain factors GL1–GL*n* and GR1–GR*n* and selects the delay terminals TL1–TL*n* and TR1–TR*n*. In this setting and selecting, necessary control data are retrieved from the memory 66 according to the state of the switch matrix 45, the dials 41, 48 and 49, and the command switch 50).

In order to provide the echo, the effector is functionally comprised of delay means in the form of the delay unit 61 for variably delaying the input signal to output stepwise delayed signals and a separately delayed signal, means for multiplying the separately delayed signal with a certain gain factor and for adding the multiplied result to the input signal to thereby feed back the multiplied result to the delay unit 61, and synthesizing means (including the output adder 15) for multiplying the stepwise delayed signals with corresponding gain factors which are determined by a parameter indicative of the echo level, and for summing these multiplied results and the input signal to synthesize ail output signal. Further, first parameter setting means in the form of the dial 41 independently sets a first parameter representative of the echo level. Second parameter setting means in the form of the microcomputer 65 selects one of the stepwise delayed signals and sets the suitable delay time of the separately delayed signal according to the parameter correlationship memorized in parameter information memory means in the form of the memory 66 and according to the value of the first parameter set by the first parameter setting means. The memory means, i.e., the memory 66 further stores initial values of the various parameters in a set by set in correspondence to a plurality of effect species. The switch matrix 45 is actuated to designate a desired one of the effect species or effect kinds. One set of the initial values of the parameters are read out from the memory means according to the designated effect species for initial setting of the effector.

Next, the description is given for the parameter adjustment by means of the dials and the microcomputer. In FIG. 2, the dials 41, 48 and 49 are indicated illustratively by equivalent variable resistors or potentiometers which input divided voltages. Actually, the analog voltages which vary by actuation of the dials are converted by A/D converters into corresponding digital signals, which are then fed to the microcomputer 65 as input parameter values by the dials. In the preceding stage of the effector, the gain factors or coefficients GD1–GD*n* are directly set by the dial 41. The gain factor GF is set dependently on the values of GD1–GD*n*. Further, the selection of the delay terminals TD1–TD*n* and TF is controlled dependently on the values of GD1–GD*n*. For example, the memory 66 provisionally stores a table which indicates interrelationship among the parameters, i.e., the values of the various gain factors and the selection orders of the delay terminals. The table is accessed according to the input values of GD1–GD*n* for reading out data effective to determine the value of GF and to determine the selection of the delay terminals TD1–TD*n* and TF. In this embodiment, the interrelation is experimentally determined between the gain factors and the delay terminals, under which the echo level is linearly varied in response to the actuation of the echo level dial. The thus determined interrelation is memorized as the table data.

As described above, normally the dial 41 is only actuatable to adjust the echo level. However, by opening the sealed box 46, the dial 48 can be actuated to adjust the delay time and the dial 49 can be actuated to adjust the repeat. Consequently, the memory 66 stores a three-dimensional data table which indicates the interrelation among the echo level, the delay time and the repeat, thereby determining total or integral setting of the gain factors and selecting of the delay terminals when each of the dials 41, 48 and 49 is actuated.

The switch matrix 45 has seven buttons 450–456 which are assigned to various kinds of vocal effects. One of the buttons is depressed to select a desired kind of the vocal effect so that the initial set of the parameter values corresponding to the selected vocal effect are read out from the memory 66. The microcomputer 65 operates according to the parameter values to set the gain factors GD1–GD*n* and GF and to select the delay terminals TD1–TD*n* and TF. By such an operation, initial values of the parameters are set in the echo effector. Thereafter, the user may actuate the dials to vary the initial values to modify the selected vocal effect.

In the succeeding stage of the effector, the setting of the gain factors and the selecting of the delay terminals are carried out by means of the switch matrix 45. Namely, upon an actuation of the switch matrix 45, control data are retrieved from the memory 66. The microcomputer 65 operates according to the retrieved control data to set the gain factors GL1–GL*n* and GR1–GR*n* and to select the delay terminals TL1–TL*n* and TR1–TR*n*.

Figures 3, 4:
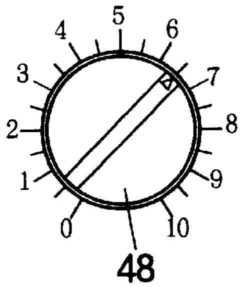
FIG. 3 shows a plan view of ac dial coupled to the echo effector.
FIG. 4 is a table diagram showing a correspondence between a scale of the dial dial a range of a delay time parameter.

Next, the description is given for shiftable range setting of the dials, exemplified by the dial 48 which is actuated to adjust the delay time. FIG. 3 shows a detailed plan view of the dial 48. The dial 48 has a ring scale composed of ordered radial marks of "0" to "10" at a pitch of "0.5". In the figure, the dial 48 is positioned to point a mark "6.5".

In this embodiment, correspondence between the scale of the dial and a range of the delay time is occasionally changed by depression of the command switch 50. In detail, as shown in FIG. 4, before the range change, the dial 48 points the mark "6.5" so that the delay time is read "165 msec" within an old range. Accordingly the delay time at the terminal TF of the delay unit 61 is set to the read value "165 msec". Then, the switch 50 is turned on to command the range change. After the range change, the old range of the delay time is shifted so that the value corresponding to the pointed mark "6.5" is shifted to correspond to a center mark "5.0". Stated otherwise, the previous set value "165 msec" is shifted to correspond to the center mark "5.0". Accordingly, the old range 100–200 msec of the delay time is upward slid to a new range 115–215 msec, thereby allowing upward extended adjustment of the delay time. The switch 50 may be depressed twice or more, so that the range is slid upward successively. The range can be shifted downward by actuating the dial 48 to point a desired mark smaller than "5.0" and subsequently by depressing the command switch 50. By such a manner, many and unspecified users can select a desired range as they like. Further, the command switch 50 is actuated after the setting of the echo level, the delay time and the repeat by the dials 41, 48 and 49, so that these set parameters are memorized to reserve the desired echo effect. Later on, the menmorizecd parameters are read out to restore the desired echo effect.

Figure 5:
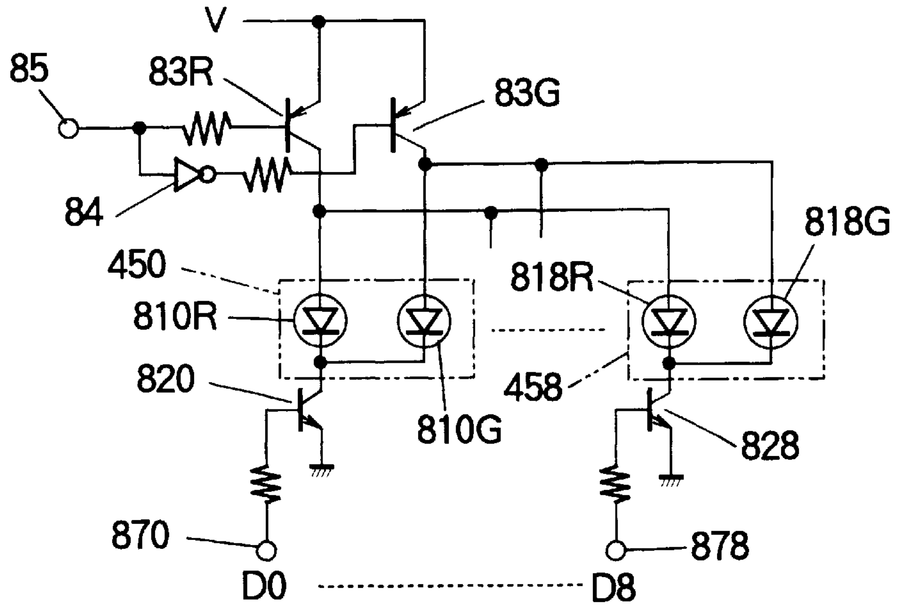
FIG. 5 is a circuit diagram showing an illumination system of switches provided in the echo effector.

Next, the description is given for detailed structure of the switch matrix or switch group 45. As noted before, each button contained in the switch group 45 is formed of half-transparent plastic material. A pair of LEDs are disposed inside one button to light the same in red under the selected state and to light the button in green under the non-selected state. FIG. 5 shows an electrical lighting structure of the switch group or switch matrix. As shown in the figure, a first button 450 encloses therein a pair of LED 810R which emits red light and LED 810G which emits green light. Each cathode of the LED 810R and the LED 810G is commonly connected to the ground through an emitter and collector path of a transistor 820. A base of the transistor 820 is connected to a terminal 870 through a resistor. The terminal 870 receives a drive signal D0 to drive the transistor 820 to light either of LED 810R and LED 810G. The remaining buttons 451–458 enclose therein a pair of LEDs and have the same structure as the first button 450.

On the other hand, anodes of the red LEDs 810R–818R are commonly connected altogether. A transistor 83R, is interposed between that common connecting point and a power supply line V. In similar manner, anodes of the green LEDs 810G–818G are commonly connected to each other. Another transistor 83G is interconnected between that common junction and the power supply line V. A base of the transistor 83R receives a control signal as it is from a terminal 85. A base of the other transistor 83G receives an inverted form of the control signal through an inverter 84. Namely, the pair of the transistors 83R and 83G are alternatively turned on by the control signal applied to the terminal 85.

The terminals 85 and 870–878 are connected to the microcomputer 65 (FIG. 2). The microcomputer 65 detects the state of the respective buttons 450–458 and controls a light color of each button according to the detected states in time-divisional manner. Namely, the microcomputer 65 feeds to the terminal 85 the control signal effective to determine which of the red and green colors is assigned to each of the buttons 450–458 in the time-divisional manner, while the microcomputer 65 successively applies the drive signals D0–D8 to scan the buttons 450–458 in synchronization with the control signal.

For example, the first button 450 is lighted red, while the remaining buttons 451–458 are lighted green. In such a case, the microcomputer 65 applies the control signal of a high level to the terminal 85 at a first timing to thereby turn the transistor 83R on. Consequently, only the LED 810R is turned on at this moment to thereby light the button 450 in red. At a subsequent timing, the microcomputer 65 switches the control signal to a low level to turn the transistor 83G on. At this moment, only the drive signal D1 is turned to the high level. Accordingly, only the LED 811G is activated at this moment to thereby light the button 451 in green. Thereafter, similar operation is repeated for the buttons 452–458. By such a manner the set of buttons 450–458 is cyclicly scanned to light the buttons in either of red and green. The pair of the red and green LEDs are selectively activated to visually indicate the selected and non-selected states of the switch matrix 45. More importantly, it is not necessary to provide a transistor to each LED, but the total number of the transistors is only a sum of the number of buttons and the number of the light colors (9+2=11 in the FIG. 5 construction), thereby simplifying the circuit structure.

Figure 8:
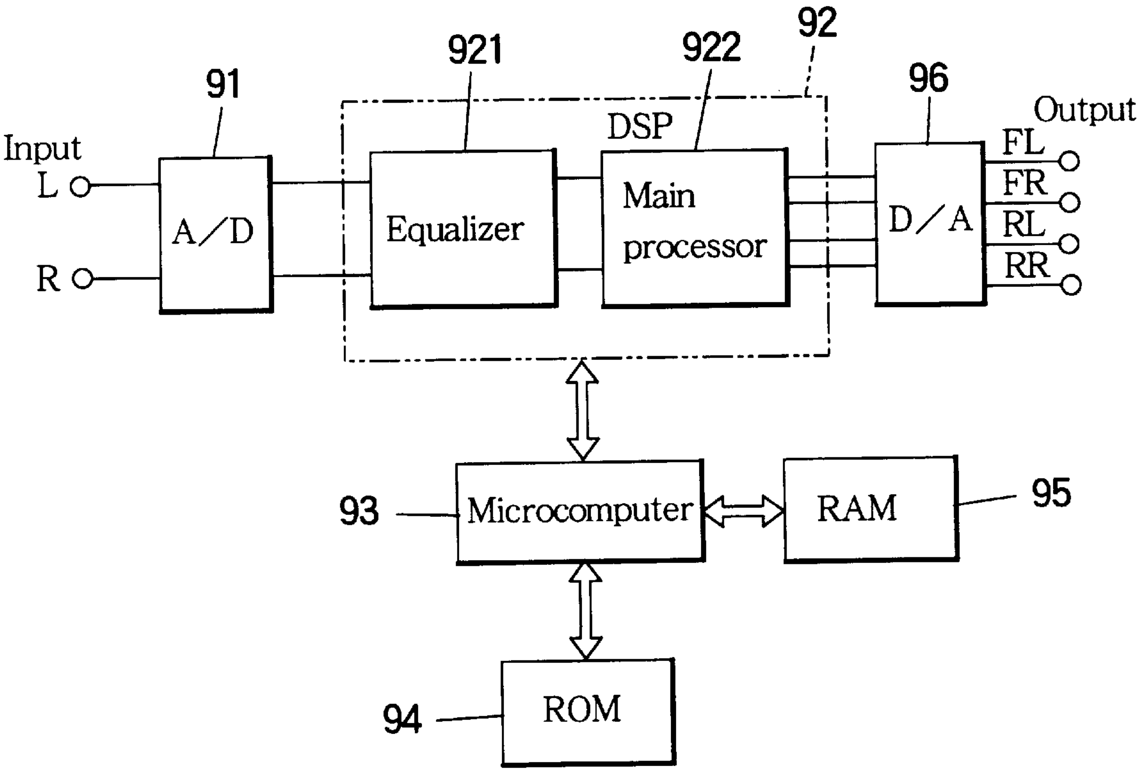
FIG. 8 is a structural block diagram showing an embodiment of the sound field effector integrated in the inventive karaoke amplifier.

Next, the description is given for a sound field effector incorporated in the karaokc amplifier of FIG. 1. FIG. 8 shows a basic construction of the sound field effector. As shown, an A/D converter 91 converts a pair of audio input signals L and R corresponding to left and right stereophonic channels into digital signals, which are fed to a subsequent digital signal processor (DSP) 92. The DSP 92 is composed of an equalizer 921 and a main processor 922, and is controlled by a microcomputer 93 to carry out various processes. The equalizer 921 controls a frequency response of the digital signal. The main processor 922 applies delay and addition operation to the digital signal according to a given algorithm so as to synthesize reflection or reverberation sounds by the delay operation, which would simulate a virtual space. The microcomputer 93 operates according to a control program stored in a ROM 94 to control the DSP 92. During the control procedure, the microcomputer 93 writes and reads various data into and from a RAM 95. A D/A converter 96 converts the digital signals subjected to the sound field process by the DSP 92 into four analog audio signals FL, FR, RL and RR corresponding to four loudspeakers of front left, front right, rear left and rear right.

Before describing a best mode of the sound field effector, a simple mode is briefly discussed to facilitate understanding of the invention. The sound field effector utilizes a plurality of parameters to adapt the DSP 92 to a desired sound field. If the sound field is to be changed, the program which determines the parameters is replaced by another to synthesize suitable reflection and reverberation sounds. The ROM 94 provisionally stores different programs corresponlding to various typical rooms such as a concert-hall and a live house so as to create a variety of sound fields.

In the simple mode, the provisionally prepared program is designed to create a sound field simulative of a general virtual room. Therefore, a user needs to modify the program in matching with a specific room in which the karaoke amplifier is actually installed.

Figure 9:
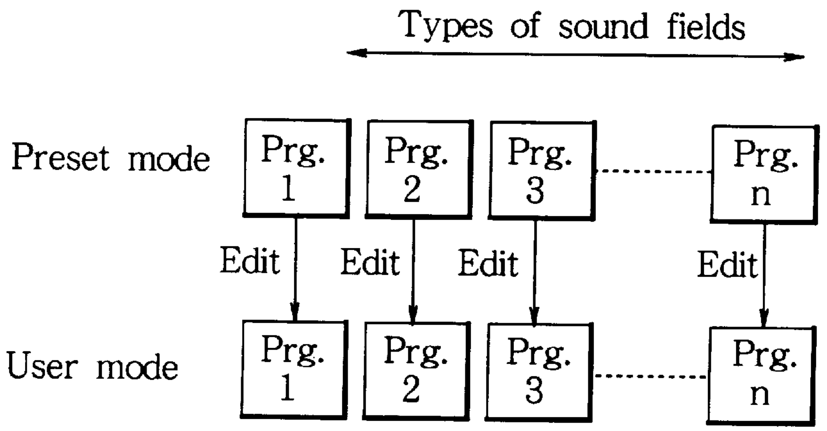
FIG. 9 is an illustrative diagram showing an edit operation of programs.

For this purpose, as shown in FIG. 9, the sound field effector is provided with a preset mode storage and a user mode storage. The preset mode storage stores a plurality of programs Prg.1–Prg.n for a plurality of sound field types, which are designed to create a sound field in a general virtual room. The user edits these original programs in matching with a specific actual room in which the karaoke amplifier is installed. The user mode storage stores the modified programs, which are selectively called to create a desired sound field adapted to the actual room situation. However, if the karaoke amplifier is relocated to another room, such an editing work must be done again.

Figure 6:
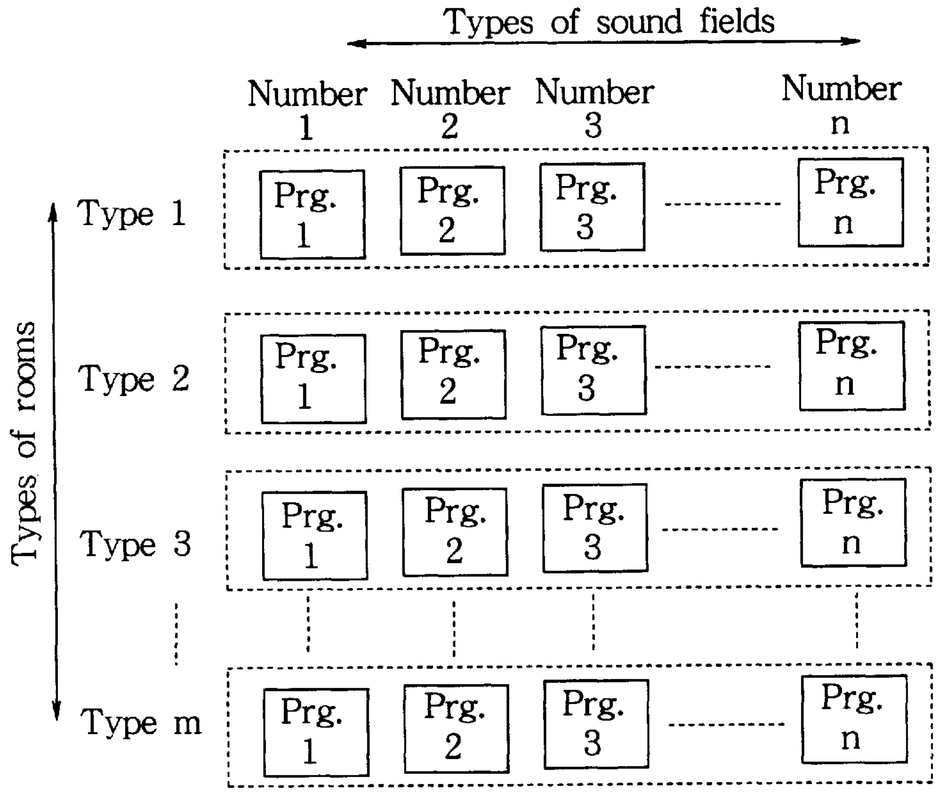
FIG. 6 is a schematic diagram showing operation of a sound field effector installed in the karaoke amplifier.
Figure 7:
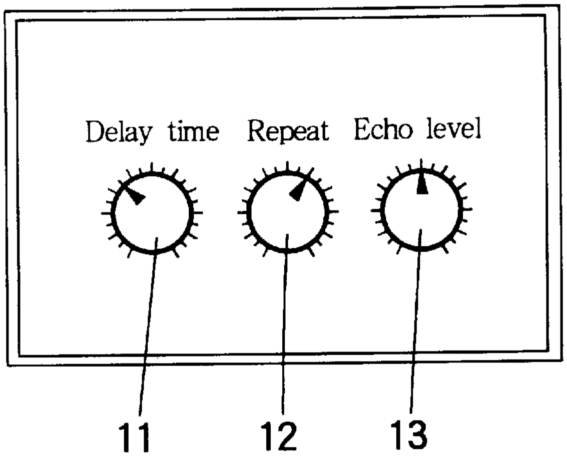
FIG. 7 shows a front view of all operation panel of a conventional echo effector.

Now, the best mode of the sound field effector shown in FIG. 8 is described in conjunction with FIG. 6. In this embodiment, a plurality of programs are provisionally prepared correspondingly to not only types of sound fields, but also types of room situations. The type of the room situation is classified in terms of typical floor plan, typical accommodation capacity and typical frame construction such as woodwork and concrete steel.

In operation of the sound field effector, the user initially designates a type of the room situation in which the karaoke amplifier is installed. This room type designation is inputted by means of an infra-red remote controller (not shown in the figure) through the photo-receiver 53 (FIG. 1). The designated room situation is indicated by type i. Then, the user designates a desired type of the sound field indicated by number k. After the designation of the sound field type or sound field kind and the room type, a particular program identified by the number k and the type i is retrieved from the ROM 94 to set the algorithm for the sound field control. By such a manner, the user can obtain a desired sound field adapted to the actual room situation. Once the karaoke amplifier is installed, normally the room type is unchanged. Therefore, the room type is only changed at the initial installation or at relocation. Otherwise, the sound field effector is prohibited to change the room type. When the room type is changed from i to j by the relocation of the karaoke amplifier, the old program numbered k belonging to the type i is replaced by at new program numbered k belonging to the type j.

The inventive sound field effector or sound field controller must store the different programs in the ROM 94 in correspondence to the types of the room situations. However, the user does not need to edit the programs, but the maker presets versions of the programs for the various types of the room situations (the user does not commit the preparation of the programs). Therefore, after the sound field controller is installed, the user simply designates a type of a desired sound field in order to obtain a sound field effect adapted to the room situation, thereby satisfying both of the operability of the effector and the quality of the sound field. In modification of the sound field effector, the designation of the room type is allowed only when the effector is installed, and thereafter the designation is fixed or locked unless otherwise exceptionally requested.

As described above, the invention can generally facilitate setting of effects in the effector apparatus. Specifically, according to the first aspect of the inventions, the user can readily create a desired echo effect or the like without complicated dial operation even though the echo effect is determined by a plurality of parameters. Further, according to the second aspect of the invention, a range of the variable parameter can be extensively shifted by the switch and dial operation. Therefore, many and unspecified users of the karaoke amplifier can freely input at desired value of the parameter as they like. Moreover, according to the third aspect of the invention, the sound field effector stores the control programs corresponding to the types of the room situations, which, are not prepared by the user, but which are preset by the maker. Therefore, the user can readily create a sound field adatpted to the actual use and situation of the sound field effector.

What is claimed is:

1. In an effector for imparting an effect to an audio signal based on values of a plurality of parameters, the parameters being mutually interrelated to each other where an adjustment of any one of the plurality of mutually interrelated parameters affects the values of remaining parameters, the effector including a parameter setting apparatus comprising:

a memory for storing data representative of an interrelationship among the plurality of the mutually interrelated parameters;

a first setting control for independently setting one or more of the mutually interrelated parameters to desired values; and a second setting control for dependently setting the remaining mutually interrelated parameters to appropriate values according to the desired values of one or more of the mutually interrelated parameters independently set by the first setting control and according to the data stored in the memory and representative of the interrelationship among the plurality of the mutually interrelated parameters.

2. The effector according to claim 1, wherein the memory stores data representative of a three dimensional interrelationship among parameters including a delay time, a repeat and an echo level, the parameters being suitably set to create a desired echo effect.

3. The effector according to claim 1, wherein the parameter setting apparatus further includes:

a second memory storing data representative of a plurality of effects such that each effect is represented in terms of a set of initial values of the parameters; and a section for selecting a desired effect so that the set of the initial values of the parameters corresponding to the desired effect is read out from the second memory so as to impart the desired effect to the audio signal.

4. In an effector for imparting an effect to an audio signal according to a value of a parameter, the effector including a parameter setting apparatus comprising:

an input section for receiving user inputs according to a scale composed of ordered marks to set the parameter and for receiving a user command to change a range of the parameter;

a memory for storing data representative of a correspondence between the scale of the input section and the range of the parameter;

a control for determining the value of the parameter within the range according to a mark based on the data representative of the correspondence between the scale and the range; and an editing section for editing the data representative of the correspondence between the scale and the range in the memory in response to the user command so as to change the range.

5. The effector according to claim 4, wherein the editing section indicates a shift amount of the range for shiftably editing the data representative of the correspondence between the scale and the range by the shift amount in response to a shift command so as to shift the range relative to the scale.

6. In an effector for imparting an effect to an audio signal based on values of a plurality of parameters, the parameters being mutually interrelated to each other, the effector including a parameter setting apparatus comprising:

a memory for storing data representative of an interrelationship among the plurality of the mutually interrelated parameters, wherein the memory stores data representative of a three dimensional interrelationship among parameters including a delay time, a repeat and an echo level, the parameters being suitably set to create a desired echo effect;

a first setting control for independently setting one or more of the mutually interrelated parameters to desired values; and a second setting control for dependently setting the remaining mutually interrelated parameters to appropriate values according to the desired values of one or more of the mutually interrelated parameters independently set by the first setting control and according to the data stored in the memory and representative of the interrelationship among the plurality of the mutually interrelated parameters.

7. The effector according to claim 6, wherein the parameter setting apparatus further includes:

a second memory storing data representative of a plurality of effects such that each effect is represented in terms of a set of initial values of the parameters; and a section for selecting a desired effect so that the set of the initial values of the parameters corresponding to the desired effect is read out from the second memory so as to impart the desired effect to the audio signal.

* * * * *